(12) United States Patent
Wodnicki et al.

(10) Patent No.: US 8,742,646 B2
(45) Date of Patent: Jun. 3, 2014

(54) ULTRASOUND ACOUSTIC ASSEMBLIES AND METHODS OF MANUFACTURE

(75) Inventors: Robert Gideon Wodnicki, Niskayuna, NY (US); Charles Edward Baumgartner, Niskayuna, NY (US); David Martin Mills, Niskayuna, NY (US); Kevin Matthew Durocher, Waterford, NY (US); William Hullinger Huber, Niskayuna, NY (US); George Charles Sogoian, Glenville, NY (US); Christopher James Kapusta, Delanson, NY (US)

(73) Assignee: General Electric Company, Niskayuna, NY (US)

( * ) Notice: Subject to any disclaimer, the term of this patent is extended or adjusted under 35 U.S.C. 154(b) by 103 days.

(21) Appl. No.: 13/433,422

(22) Filed: Mar. 29, 2012

(65) Prior Publication Data

US 2013/0257224 A1 Oct. 3, 2013

(51) Int. Cl.
*H01L 41/08* (2006.01)
*B06B 1/06* (2006.01)

(52) U.S. Cl.
CPC .................................. *B06B 1/0622* (2013.01)
USPC ......................................................... 310/334

(58) Field of Classification Search
CPC .................................................... B06B 1/0622
USPC .................................. 310/326, 327, 334–337
See application file for complete search history.

(56) References Cited

U.S. PATENT DOCUMENTS

| 4,414,482 A * | 11/1983 | Lewis et al. .................... 310/334 |
| 5,311,095 A | 5/1994 | Smith et al. |
| 5,329,496 A | 7/1994 | Smith |
| 5,548,564 A | 8/1996 | Smith |
| 6,865,140 B2 | 3/2005 | Thomenius et al. |
| 7,052,464 B2 | 5/2006 | Wodnicki |
| 7,135,806 B2 | 11/2006 | Blakley |

(Continued)

FOREIGN PATENT DOCUMENTS

| WO | 2007017780 A2 | 2/2007 |
| WO | 2008012748 A2 | 1/2008 |

OTHER PUBLICATIONS

Mackerle, "Finite Element Analysis and Simulation of Adhesive Bonding, Soldering and Brazing—an Addendum: A Bibliography", Modeling and Simulation in Materials Science and Engineering, vol. 10, pp. 637-671, 2002.

(Continued)

*Primary Examiner* — J. San Martin
(74) *Attorney, Agent, or Firm* — Eileen B. Gallagher

(57) ABSTRACT

An ultrasound acoustic assembly includes a number of ultrasound acoustic arrays, each array comprising an acoustic stack comprising a piezoelectric layer assembled with at least one acoustic impedance dematching layer and with a support layer. The acoustic stack defines a number of dicing kerfs and a number of acoustic elements, such that the dicing kerfs are formed between neighboring ones of the acoustic elements. The dicing kerfs extend through the piezoelectric layer and through the acoustic impedance dematching layer(s) but extend only partially through the support layer. The ultrasound acoustic assembly further includes a number of application specific integrated circuit (ASIC) die. Each ultrasound acoustic array is coupled to a respective ASIC die to form a respective acoustic-electric transducer module. Methods of manufacture are also provided.

6 Claims, 5 Drawing Sheets

(56) References Cited

U.S. PATENT DOCUMENTS

| | | | |
|---|---|---|---|
| 7,285,898 B2 * | 10/2007 | Sawada | 310/334 |
| 7,311,667 B2 | 12/2007 | Cai et al. | |
| 7,795,784 B2 * | 9/2010 | Davidsen et al. | 310/334 |
| 7,830,069 B2 * | 11/2010 | Lukacs et al. | 310/334 |
| 7,892,176 B2 | 2/2011 | Wodnicki et al. | |
| 8,242,665 B2 * | 8/2012 | Robinson et al. | 310/334 |
| 2005/0261590 A1 | 11/2005 | Ogawa et al. | |
| 2007/0046149 A1 | 3/2007 | Zipparo et al. | |
| 2008/0315331 A1 | 12/2008 | Wodnicki et al. | |
| 2008/0315724 A1 * | 12/2008 | Kunkel, III | 310/334 |
| 2009/0182229 A1 | 7/2009 | Wodnicki | |
| 2009/0182233 A1 | 7/2009 | Wodnicki | |
| 2010/0255623 A1 | 10/2010 | Huang | |
| 2011/0071397 A1 | 3/2011 | Wodnicki et al. | |

OTHER PUBLICATIONS

Lin et al., "Packaging of Large and Low-Pitch Size 2D Ultrasonic Transducer Arrays", IEEE 23rd International Conference on Micro Electro Mechanical Systems (MEMS), pp. 508-511, Jan. 24, 2010.

Baumgartner, "Methods of Fabricating Ultrasonic Transducer Assemblies", U.S. Appl. No. 12/947,856, filed Nov. 17, 2010.

Woychik et al., "Tileable Sensor Array", U.S. Appl. No. 12/956,194, filed Nov. 30, 2010.

Wodnicki et al., "An Elastic Conformal Transducer Apparatus", U.S. Appl. No. 13/282,949, filed Oct. 27, 2011.

International Search Report and Written Opinion issued in connection with corresponding PCT Application No. PCT/US2013/033527 dated Nov. 11, 2013.

\* cited by examiner

ULTRASOUND ACOUSTIC ASSEMBLIES AND METHODS OF MANUFACTURE

BACKGROUND

The invention relates generally to ultrasonic transducer assemblies and, more particularly, to methods of fabricating ultrasonic transducer assemblies.

Ultrasonic transducer assemblies are typically employed in applications including non-destructive evaluation (NDE) and medical diagnostic imaging, such as ultrasound applications and computed tomography (CT). The ultrasonic transducer assembly generally includes an array of ultrasonic transducers coupled to an electronics array. As explained in commonly assigned U.S. Pat. No. 7,892,176, Robert Wodnicki et al. "Monitoring or imaging system with interconnect structure for large area sensor array," which is incorporated by reference herein in its entirety, transducer arrays in ultrasound probe assemblies typically span an area no larger than about 20 $cm^2$. For new medical applications, such as screening for internal bleeding and tumors, much larger arrays, on the order of 300 $cm^2$, are required. In non-medical applications even larger arrays may be desired.

The ultrasonic transducer array generally includes hundreds or thousands of individual transducers. Piezoelectric transducers (for example, PZT) are a widely used type of ultrasonic transducer. Piezoelectric sensors generally include a piezoelectric material capable of changing physical dimensions when subjected to electrical or mechanical stress. In addition, piezoelectric sensors may include layers of matching materials and damping materials.

Similarly, the electronics array includes hundreds or thousands of integrated interface circuits (or "cells") which are electrically coupled to provide electrical control of the transducers for beam forming, signal amplification, control functions, signal processing, etc. In particular, each transducer sub-array or chip in the transducer array is typically coupled to an integrated circuit chip to provide individual control of each sensor.

Such large arrays may be formed by tiling of a large number of transducer modules in rows and columns. The array may be one dimensional (1D) (a linear array or row of acoustic elements) for two-dimensional (2D) imaging. Similarly, the array may be a 2D array for volumetric imaging. Each transducer module comprises a subarray of transducer cells and an integrated circuit coupled to the subarray. Fabricating the transducer array and the electronics array, and coupling the two arrays together, provides a number of design challenges. For example, performance of a large area transducer array is significantly degraded when there are significant variations in the spacing between modules.

Further, for many current medium-sized arrays, significant muting challenges exist to bring the connections from the nearby electronics into the sensor array. In addition, these arrays are limited by the available routing density and also by the parasitic capacitances of the traces.

It would therefore be desirable to provide acoustic arrays with controlled spacing between the transducer elements. It would further be desirable to provide acoustic arrays that can be readily assembled into a larger assembly and coupled with front end electronics in an arrangement with low parasitic capacitance. It would also be desirable to provide methods of manufacturing the acoustic arrays and the overall assemblies.

BRIEF DESCRIPTION

One aspect of the present invention resides in an ultrasound acoustic assembly that includes a number of ultrasound acoustic arrays, where each array includes an acoustic stack comprising a piezoelectric layer assembled with at least one acoustic impedance dematching layer and with a support layer. The acoustic stack defines a number of dicing kerfs and a number of acoustic elements, such that the dicing kerfs are formed between neighboring ones of the acoustic elements. The dicing kerfs extend through the piezoelectric layer and through the acoustic impedance dematching layer(s) but extend only partially through the support layer. The ultrasound acoustic assembly further includes a number of application specific integrated circuit (ASIC) die. Each ultrasound acoustic array is coupled to a respective one of the ASIC die to form a respective acoustic-electric transducer module.

Yet another aspect of the present invention resides in a method of manufacturing an ultrasound acoustic assembly. The manufacturing method includes assembling a piezoelectric layer with at least one acoustic impedance dematching layer and with a support layer to form an acoustic stack. The manufacturing method further includes dicing the acoustic stack to form a number of acoustic elements, such that a number of dicing kerfs are formed between neighboring ones of the acoustic elements. The dicing kerfs extend only partially through the support layer. The manufacturing method further includes connecting each of the diced, acoustic stacks to a respective one of a number of application specific integrated circuit (ASIC) die, to form a respective acoustic-electric transducer module.

Another aspect of the present invention resides in a method of manufacturing an ultrasound acoustic assembly. The manufacturing method includes depositing an under-bump metallization (UBM) on a number of acoustic impedance dematching regions. The manufacturing method further includes disposing a number of conductive bumps on a substrate or on a number of application specific integrated circuit (ASIC) die. The manufacturing method further includes disposing the acoustic impedance dematching regions on the substrate or on the ASIC die, where the conductive bumps are disposed between the acoustic impedance dematching regions and the substrate or ASIC die. The manufacturing method further includes performing a reflow operation, such that a number of uniform electrical connections are formed between the acoustic impedance dematching regions and the respective ASIC die or substrate, and disposing at least one piezoelectric region on the acoustic impedance dematching regions to form respective acoustic stacks.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
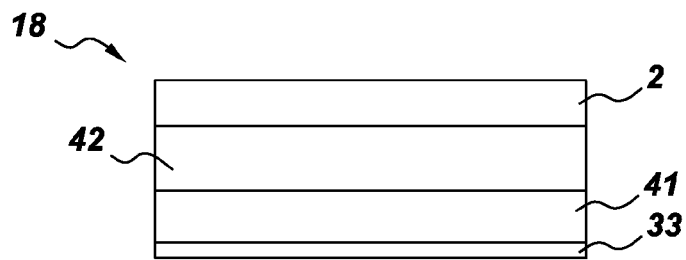
FIG. 1 is a schematic cross-sectional view of an example acoustic stack.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term (e.g., "the array" may include one or more arrays, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

A method of fabricating one or more ultrasound acoustic arrays 40 is described with reference to FIGS. 1-6. As indicated, for example, in FIG. 1, the fabrication method includes assembling a piezoelectric layer 42 (for example, PZT) with at least one acoustic impedance dematching layer 41 and with a support layer 2 to form an acoustic stack 18. For particular arrangements, the piezoelectric layer 42 comprises single crystal PZT. Non-limiting examples of the dematching layer includes dense, high modulus metals, such as molybdenum or tungsten, and high density ceramics, such as tungsten carbide. For particular configurations, the acoustic impedance dematching layer 41 comprises a tungsten carbide high impedance dematching layer 41. The dematching layer 41 has an acoustic impedance greater than that of the piezoelectric layer 42. For the configuration shown in FIG. 1, the support layer 2 may have an acoustic impedance between that of water and the PZT layer 42.

For the process illustrated by FIGS. 1-3 and 5, the fabrication method further includes dicing the acoustic stack 18 to form a number of acoustic elements 4, such that a number of dicing kerfs 14 are formed between neighboring ones of the acoustic elements 4. As indicated, for example, in FIGS. 2, 3 and 5, the dicing kerfs 14 are deep enough to separate the acoustic elements 4 from one another. However, for the illustrated arrangement, the dicing kerfs 14 extend only partially through the support layer 2, in order to maintain a common mechanical substrate support for the pillars in the array by means of remaining support layer (for example, graphite) material. The dicing may be performed using, for example, a standard dicing saw or using laser dicing. Alternatively, a deep reactive ion or other semiconductor type etch could be used with an intervening masking step to separate the acoustic elements. As used here. "dicing" should be understood to encompass mechanical dicing techniques (saw, laser etc.), as well as chemical separation techniques (various etching processes).

For particular processes, the support layer 2 comprises a graphite support layer 2. Other candidate materials for support layer 2 include, without limitation, ceramics, silicon, flexible organic polymers, metal filled graphite, ceramic powder filled epoxy, glass, and glass-ceramics.

For the illustrated techniques, the fabrication method further includes depositing an under-bump metallization (UBM) 33 on the acoustic impedance dematching layer 41. See, for example, FIG. 1. Typically the UBM 33 is deposited on the acoustic impedance dematching layer 41 prior to assembling the acoustic stack. Example UBM may comprise titanium-nickel-gold. However, other metallization could be used as well, including thick gold, or other metals. Example techniques for applying the UBM include, without limitation, plating, sputtering, and evaporative processes. In addition, the UBM pads could be continuous across the entire top surface of each acoustic element 4 or they could also be patterned into smaller square or circular pads, for example using a lift-off process or by shadow-masking. More particularly, the UBM 33 may be patterned lithograhically before attaching solder bumps 35. Beneficially, the required solder bump can be smaller for a patterned pad, while still maintaining the required standoff height for assembly.

Figure 3:
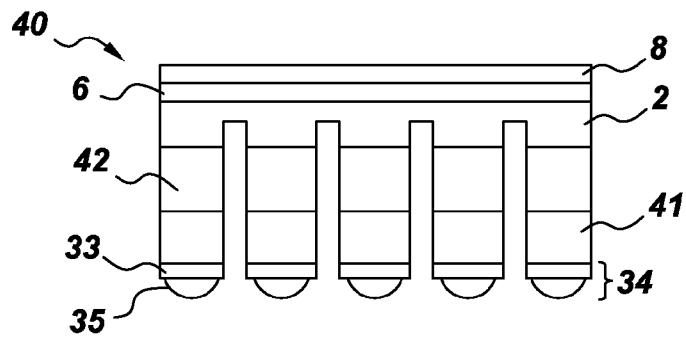
FIG. 3 shows the diced, acoustic stack of FIG. 2 after bumping and after the common electrode has been deposited.
Figure 4:
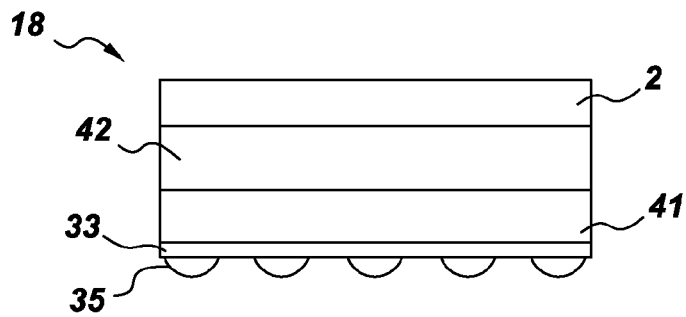
FIG. 4 is a schematic cross-sectional view of an example acoustic stack, where the acoustic impedance matching layer has been bump plated prior to dicing.

For particular processes, the fabrication method further includes bump plating the acoustic impedance dematching layer 41 to form a number of raised electrical contacts 34, as shown, for example, in FIG. 3. For example, solder bumps 35 may be formed on the UBM 33 to form the electrical contact 34. Bumping may be accomplished using standard techniques including electroplating, screen printing, transfer processes, or solder-jetting. The material for bumping may be any suitable material such as eutectic tin/lead solder or a lead-free solder. In certain applications, indium bumps, low temperature bismuth alloy bumps, or other techniques may also be used. For particular configurations, it is advantageous to use a low temperature solder, such as bismuth or indium, in order to avoid the need to subsequently re-pole the piezoelectric layer 42.

In one non-limiting example, bump height is not critical, and a plated height of about 25-50 micrometers can be used. For the processes illustrated in FIGS. 2-4, the bump plating is performed after the acoustic stack 18 has been assembled. That is, the bumps 35 are formed after the acoustic stack 18 has been assembled. As noted above, the UBM 33 is typically applied prior to assembling the acoustic stack. However, for certain processes (not shown), the acoustic impedance dematching layer 41 could be bump plated prior to assembling the acoustic stack 18. Typically though, the acoustic stack 18 will be assembled prior to the bump plating. For the process shown in FIG. 4, the bump plating is performed before dicing the acoustic stack 18. Beneficially, bumping the stacks prior to dicing facilitates handling. However, the bump plating could be performed after the dicing is completed, as shown, for example in FIGS. 2 and 3. For example the UBM could be applied prior to assembling the acoustic stack 18, and the bumps 35 could be formed after the acoustic stack 18 has been diced.

For the arrangement shown in FIG. 3, the fabrication method further includes assembling a common ground electrode 6 to the diced, acoustic stack 18. For example, a suitable metal electrode 6 may be attached to the support layer 2, along with an outer matching layer 8 attached to electrode 6, to provide a common ground electrode 6 for all of the acoustic elements 4. Non-limiting examples of suitable materials for the outer matching layer 8 include ABS plastic, polyethylene, polystyrene, and unfilled epoxy. Other materials with similar acoustic impedances may be used as well.

Figure 6:
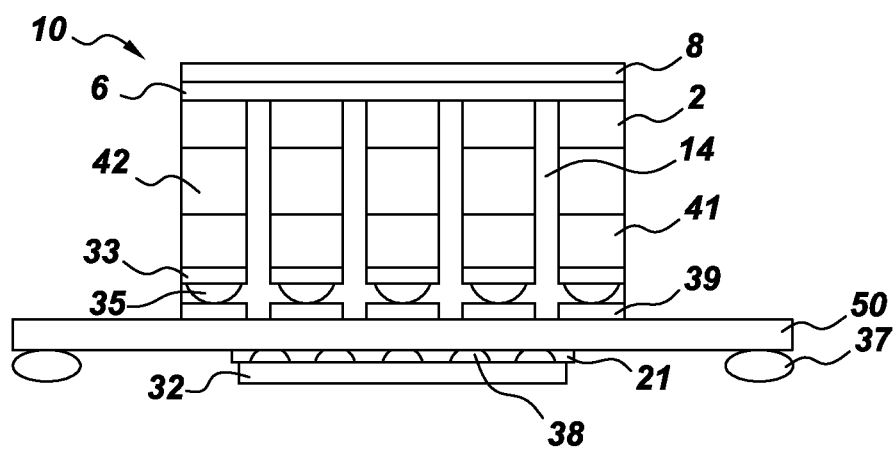
FIG. 6 is a schematic cross-sectional view of an example acoustic-electric transducer module, where the support layer was partially removed.

For particular processes, the fabrication method further includes at least partially removing the support layer 2 to further acoustically separate the acoustic elements 4 from one another, as indicated, for example, in FIG. 6. The optional removal of at least part of the support layer 2 would be performed prior to the assembly of the electrode 6 to the acoustic stack 18.

In addition to the process steps described above, additional processing may be performed. For example, prior to lamination to the piezoelectric layer 42, a tungsten carbide acoustic impedance dematching layer 41 may undergo sputtering of a layer of titanium (not shown) in order to provide a seed layer (not shown) for the UBM 33. Next, a layer of nickel may be evaporated on the tungsten carbide acoustic impedance dematching layer 41 in order to provide the proper pad for attaching the solder balls 35. This is followed by a very thin flash layer of gold (not shown) to prevent oxidation of the nickel. The tungsten carbide acoustic impedance dematching layer 41 containing the UBM 33 may then be bonded to the piezoelectric layer 42 and a graphite support layer 2 as thin, solid slabs of material bonded with an adhesive. Suitable nonconductive adhesives include, without limitation epoxy, polyurethane, and acrylate adhesives and may be bonded using high pressure. Alternately conductive and anisotropically conducting adhesives may be used to bond the dematching layer to the piezoelectric layer.

Beneficially, the above described fabrication method facilitates the fabrication ultrasound acoustic arrays 40 in a batch process, which helps reduce overall manufacturing costs for tiled modular acoustic assemblies 100, which are described below.

An ultrasound acoustic array 40 is described with reference to FIGS. 1-6. As indicated, for example, in FIGS. 1-3, the ultrasound acoustic array 40 includes an acoustic stack 18 (FIG. 1) comprising a piezoelectric layer 42 assembled with at least one acoustic impedance dematching layer 41 and with a support layer 2. The layers 2, 41, 42 are described above. For particular arrangements, the piezoelectric layer 42 comprises single crystal piezoelectric (for example, single crystal PMN-PT). As indicated, for example, in FIGS. 2 and 3, the acoustic stack 18 defines a number of dicing kerfs 14 and a number of acoustic elements 4, such that the dicing kerfs 14 are formed between neighboring ones of the acoustic elements 4. As indicated, for example, for the example configurations shown in FIGS. 2 and 3, the dicing kerfs 14 extend through the piezoelectric layer 42 and through the acoustic impedance dematching layer(s) 41 but extend only partially through the support layer 2. Beneficially, this dicing configuration provides a common mechanical substrate support for the pillars in the array (i.e., the acoustic elements 4) by means of remaining support layer (for example, graphite) material.

Figure 2:
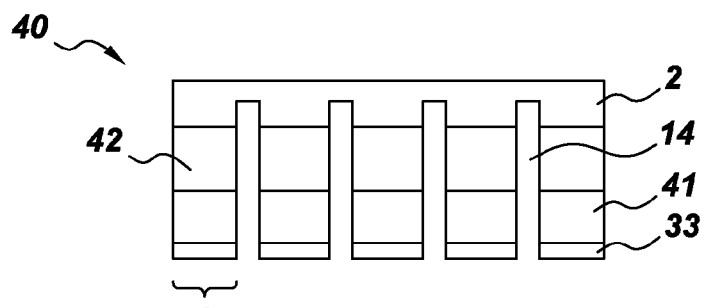
FIG. 2 shows the acoustic stack of FIG. 1 after dicing.

As indicated, for example, in FIGS. 2 and 3, the ultrasound acoustic array 40 may further include an under-bump metallization (UBM) 33 connected to the acoustic elements 4. As shown, for example, in FIGS. 2, 3 and 5, the UBM 33 is segmented, with each segment of the UBM 33 attached to an acoustic element 4. For the example configurations shown in FIGS. 3-6, the ultrasound acoustic array 40 further includes a number of conductive bumps 35 connected to the UBM 33 to form a number of raised electrical contacts 34 (FIG. 3) for the acoustic elements 4. Suitable materials for conductive bumps 35 are provided above. Alternative means for attaching the dematching layer may also be employed.

Figure 5:
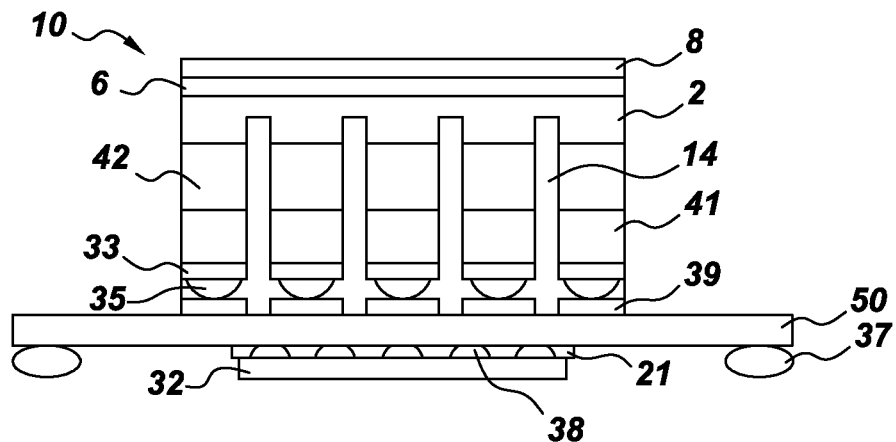
FIG. 5 is a schematic cross-sectional view of an example acoustic-electric transducer module.

For the configuration shown in FIGS. 3 and 5, the ultrasound acoustic array 40 further includes a common ground electrode 6 connected to the diced, acoustic stack 18. For example and as discussed above, a suitable metal electrode 6 may be attached to the support layer 2, along with a layer of ABS plastic 8 or other suitable material for the outer matching layer 8 attached to the electrode 6, to provide a common ground electrode 6 for all of the acoustic elements 2.

Beneficially, support layer 2 can function as a carrier providing structural stability to the individual acoustic pillars (elements 4) prior to assembly of the ultrasound acoustic array 40 to the interposer 50 (as described below). Support layer 2 allows the pillar arrays to be handled and for automated pick-and-place assembly, as discussed below. As noted above, the ultrasound acoustic arrays 40 can be fabricated in a batch process, which helps reduce overall manufacturing costs for large area acoustic arrays. Further, the resulting ultrasound acoustic arrays 40 may be tested individually, prior to assembly. This helps to ensure a high yield rate on the subsequently assembled large area acoustic arrays.

An ultrasound acoustic assembly 100 embodiment of the invention is described with reference to FIGS. 1-5 and 7. As shown for example in FIG. 7, the ultrasound acoustic assembly 100 includes a number of ultrasound acoustic arrays 40. As described above, each array comprising an acoustic stack 18 (FIG. 1) comprising a piezoelectric layer 42 assembled with at least one acoustic impedance dematching layer 41, for example, a tungsten carbide high impedance dematching layer 41, and with a support layer 2, for example a graphite support layer 2. The layers 2, 41, 42 are described above. As shown in FIGS. 2 and 3, the acoustic stack 18 (FIG. 1) defines a number of dicing kerfs 14 and a number of acoustic elements 4, such that the dicing kerfs 14 are formed between neighboring ones of the acoustic elements 4. As indicated in FIGS. 2 and 3, for example, the dicing kerfs 14 extend through the piezoelectric layer 42 and through the acoustic impedance dematching layer(s) 41 to separate the acoustic elements 4 from one another. However, for the example arrangements shown in FIGS. 2 and 3, the dicing kerfs 14 extend only partially through the support layer 2, in order to maintain a common mechanical substrate support for the pillars in the array by means of the remaining graphite material.

Figure 7:
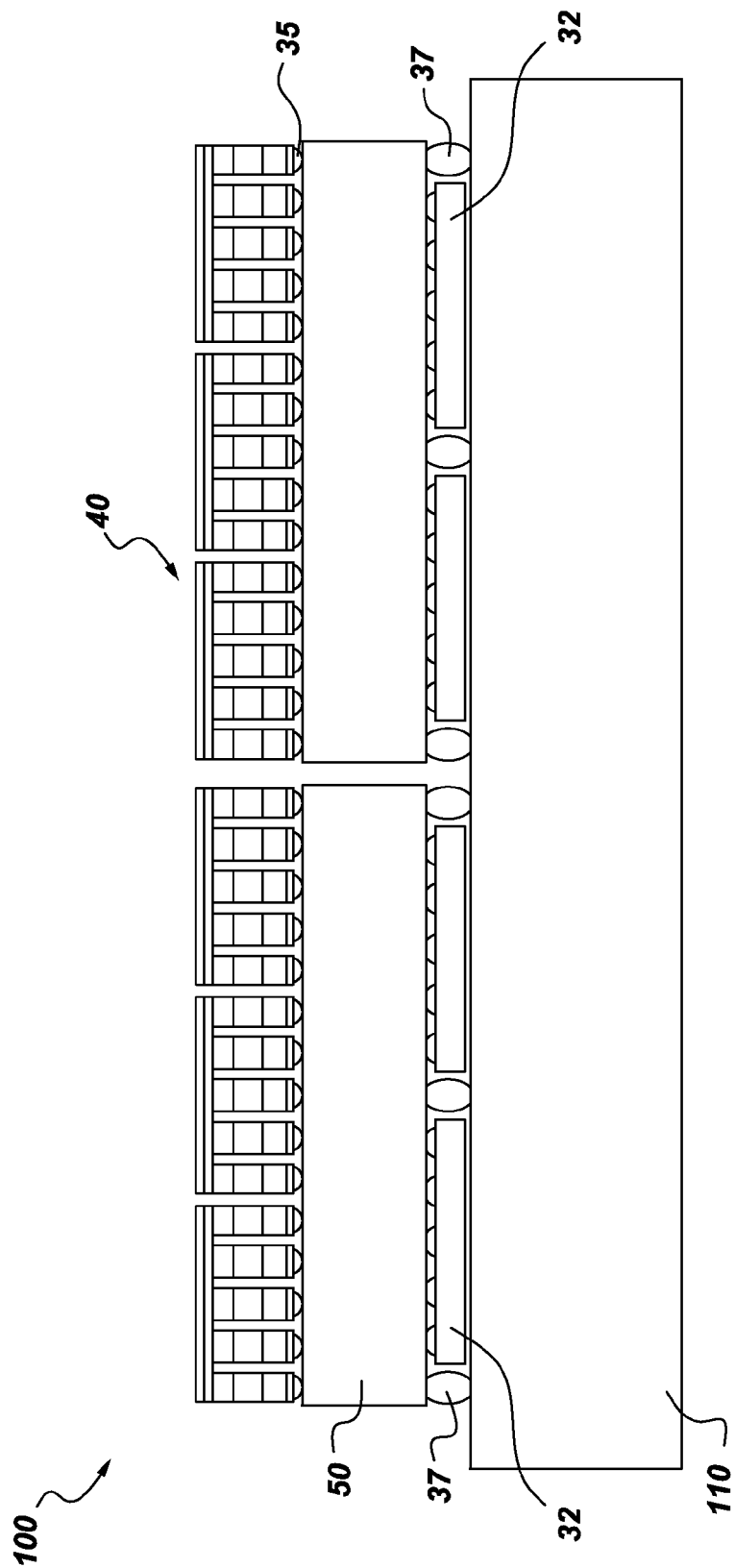
FIG. 7 is a schematic cross-sectional view of an example ultrasound acoustic assembly.

As indicated in FIGS. 5 and 7, the ultrasound acoustic assembly 100 further includes a number of application specific integrated circuit (ASIC) die 32. Each ultrasound acoustic array 40 is coupled to a respective one of the ASIC die 32 to form a respective acoustic-electric transducer module 10, as indicated in FIG. 5.

For particular arrangements, the ultrasound acoustic arrays 40 may be disposed directly on the ASIC die 32. That is, the ultrasound acoustic arrays 40 may be bonded directly to the ASIC die 32, without an interposer being disposed in-between the two. For particular arrangements, through silicon vias (TSV) (not shown) may be used to provide seamless tiling of ASICs and associated transducer stacks. The use of TSV's to time ASICs and associated transducer stacks is described for the case of capacitive micromachined ultrasonic transducers (cMUTs) sensors in commonly assigned US Patent Application Publication No. 20110071397, "Large area modular sensor array assembly and method for making the same." which is incorporated by reference herein in its entirety.

However, for the configuration shown in FIGS. 5 and 7, the ultrasound acoustic assembly 100 further includes one or more substrates 50 disposed between the ultrasound acoustic arrays 40 and the ASIC die 32. As indicated for example in FIG. 7, multiple ultrasound acoustic arrays 40 may be coupled to the respective ASIC die 32 via an interposer 50 or flexible substrate 50. For ease of illustration, reference numeral 50 is used to denote both the interposer and the flexible substrate. Non-limiting examples of interposers and flexible substrates include high density interconnects.

For the example arrangement shown in FIG. 5, the ASIC die 32 are flip-chip attached to the backside of an interposer 50 by solder bumps 38. Further, for the example configuration shown in FIG. 5, pads 39 are coupled to the interposer 50 for connection to bumps 35 on the acoustic arrays 40. Example pads 39 include, without limitation, electroless nickel immersion gold (ENIG) pads 39. For the configuration shown in FIG. 5, the ultrasound acoustic arrays 40 are attached to the interposer 50 by standard reflow solder flip-chip attach. In application, the ASIC die 32 provides the acoustic sensor interface electronics, while the interposer 50 provides communication from the ASIC die to the transducer array, as well as from the ASIC die to an external data processing system (not shown) through an associated set of I/O ball grid array (BGA) balls 37.

For the example configurations shown in FIGS. 1-5, each acoustic array 40 further comprises an under-bump metallization (UBM) 33 connected to the acoustic elements 4. As noted above and as shown, for example, in FIGS. 2, 3 and 5, the UBM 33 is segmented, with each segment of the UBM attached to an acoustic element 4. In addition, for the example configurations shown in FIGS. 3-5, each of the acoustic arrays 40 further comprises a number of conductive bumps 35 connected to the UBM 33 to form a number of raised electrical contacts 34 for the acoustic array 40. Further, for the configurations shown in FIGS. 3 and 5, each acoustic array 40 further comprises a common ground electrode 6 connected to the diced, acoustic stack 18 (FIG. 1). Each of these features is described above. In addition, the ultrasound acoustic assembly 100 may further include a base substrate 110 (FIG. 7), where the ASIC die 32 are connected to the base substrate 110. For certain configurations, the base substrate 110 may be flexible. For example, the substrate 110 may comprise a flexible organic polymer, such as polyimide, examples of which include materials marketed under the trade name Kapton®, which is commercially available from E. I. du Pont de Nemours and Company. Beneficially, a flexible substrate may be shaped to build a curved acoustic assembly. One non-limiting example of a curved acoustic assembly would be a cylindrical acoustic assembly.

As noted above, for the configuration shown in FIG. 7, the ultrasound acoustic assembly 100 further includes a base substrate 110, where the ASIC die 32 are connected to the base substrate 110. For the example arrangement shown in FIG. 5, the ASIC die 32 are connected to the interposer 50 by conductive bumps 38. For the configuration shown in FIG. 7, the interposers 50 are connected to the base substrate 100 by I/O ball grid array (BGA) balls 37. Depending on the specific application, the base substrate 110 may be rigid or flexible. For example, the substrate 110 may comprise a flexible organic polymer, such as polyimide, examples of which include materials marketed under the trade names Kapton® and Upilex®. Upilex® is commercially available from UBE Industries. Ltd. Other exemplary flexible organic polymers include polyethersulfone (PES) from BASF, polyethyleneterephthalate (PET or polyester) from E. I. du Pont de Nemours and Company, polyethylenenaphthalate (PEN) from E. I. du Pont de Nemours and Company, and polyetherimide (PEI). Beneficially, a flexible base substrate 110 may be shaped to build a curved (for example a cylindrical) acoustic assembly.

In addition to the features described above, the ultrasound acoustic assembly 100 may further optionally include an electrically non-conductive material, for example silicone, disposed within the dicing kerfs 14. Beneficially, this material enhances the structural stability of the diced, acoustic stack, as well as providing acoustic isolation and electrical isolation during re-poling and during operation. In addition, the ultrasound acoustic assembly 100 may further optionally include an AISC underfill 21 (FIG. 5), for example an epoxy underfill 21, to help secure the substrate 50 to the ASIC die 32.

Beneficially, the ultrasound acoustic assembly 100 is a relatively low cost, high yield large area transducer array. The acoustic arrays 40 are densely integrated with their respective front-end processing electronics and also have relatively minimal gaps in the uniform distribution of transducer elements across the entire assembly. Further, the relatively close coupling of the electronics layer to the transducer layer yields savings in power consumption and improvements in signal dynamic range due to the reduction of parasitic capacitances.

A method of manufacturing an ultrasound acoustic assembly 100 embodiment is described with reference to FIGS. 1-7. As indicated, for example, in FIG. 1, the manufacturing method includes assembling a piezoelectric layer 42 with at least one acoustic impedance dematching layer 41 and with a support layer (2) to form an acoustic stack 18. The layers 2, 41, 42 are described above. As shown, for example, in FIGS. 2 and 3, the manufacturing method further includes dicing the acoustic stack 18 to form a number of acoustic elements 4, such that a number of dicing kerfs 14 are formed between neighboring ones of the acoustic elements 4. As indicated in FIGS. 2 and 3, for example, the dicing kerfs 14 extend through the piezoelectric layer 42 and through the acoustic impedance dematching layer(s) 41, such that the acoustic elements 4 are separated from each other. However, the dicing kerfs 14 extend only partially through the support layer 2, in order to maintain a common mechanical substrate support for the acoustic elements.

As indicated, for example, in FIGS. 5-7, the manufacturing method further includes connecting each of the diced, acoustic stacks 18 to a respective one of a number of application specific integrated circuit (ASIC) die 32, to form a respective acoustic-electric transducer module 10. For the processes illustrated in FIGS. 5-7, the connection of the diced, acoustic arrays 18 (FIG. 1) to the respective ASIC die 32 comprises disposing the diced, acoustic stacks 18 on one or more substrates 50 and coupling the substrates(s) 50 with the ASIC die 32. Example substrates 50 include interposers 50 and flexible substrates 50. For example, after visual inspection and/or testing, the partially-diced acoustic stacks 18 may be assembled to high density interconnect(s) 50 using automated pick and play techniques. Numerically controlled pick-and-place machines (also termed "surface mount technology component placement systems") are known in the art and are typically used to place surface mount devices (electrical components) on printed circuit boards. Pick-and-place machines typically include pneumatic suction nozzles, and each nozzle head can be manipulated in three dimensions and rotated independently. Typically, the ASIC die 32 will be assembled to the interposer 50 prior to assembly of the diced acoustic stacks 18 to the interposer 50. However, for other processes, the ASIC die and the diced acoustic stacks may be assembled to the interposer(s) 50 in the same process step, and for other processes the diced, acoustic stacks may be assembled to the interposer(s) first and the ASIC die may be assembled to the interposer(s) second. Moreover, for other configurations, the diced, acoustic stacks 18 may be disposed directly on the ASIC die 32.

In addition, the manufacturing method may optionally further include performing a reflow operation, such that uniform electrical connections are formed between the diced, acoustic stacks 18 (FIG. 1) and the respective ASIC die 32 and interposer 50. For example, the reflow process reforms solders bumps 35, such that they provide uniform connections between the diced, acoustic stacks 18 and the ASIC die 32/interposer 50.

The manufacturing method may further optionally include disposing an electrically non-conductive material into the dicing kerfs 14 after performing the reflow operation. Silicone is one non-limiting example of a suitable electrically non-conductive material. After the material has been deposited, a cure may be performed. Beneficially, this material enhances the structural stability of the diced, acoustic stack, as well as providing acoustic isolation and electrical isolation during re-poling and during operation.

As a result of the high temperatures employed, the PZT may be depoled during reflow. In which case, the acoustic array may be repoled by applying a relatively high voltage (e.g. 2 V/micron PZT) for a period of time (for example, less than about two seconds). Repoling can be accomplished by grounding all supply terminals on the ASICs and applying the relatively high voltage to the common electrode of the transducer elements. A resistor may be added between the repoling voltage and the common electrode protects the ASIC from high voltage discharge. Following repoling, the array can be lensed with an acoustic material, such as Silicone.

For the particular process illustrated by FIG. 6, the manufacturing method optionally further includes at least partially removing the support layer 2 to further acoustically separate the acoustic elements 4 from one another. For this process, the support layer 2 is at least partially removed prior to the assembly of the electrode 6 to the acoustic array 40. If the support layer is completely removed, the ABS plastic 8 would be deposited on the piezoelectric layer 42. For example, a graphite support layer 2 may be ground away after placement and reflow. Alternatively, the support layer may be released. If the support layer is completely removed, the ABS plastic 8 would be deposited on the piezoelectric layer 42. If the tungsten carbide 41 is partially diced, the manufacturing method may further optionally include disposing wax between the remaining tungsten carbide pillars before (at least partially) removing the graphite layer 2, and then removing the wax afterwards.

For the particular processes illustrated by FIGS. 5-7, the manufacturing method may further optionally include depositing an under-bump metallization (UBM) 33 on the acoustic impedance dematching layer 41 and bump plating the acoustic impedance matching layer 41 to form a number of raised electrical contacts 35. For example, solder bumps 35 may be formed on the UBM 33 to form the electrical contacts 35. As noted above, the process steps may be performed in several different orders. For example, the bump plating may be performed after assembling the acoustic stack 18. Although, the UBM 33 is typically applied prior to assembling the acoustic stack. However, for certain processes, the acoustic impedance dematching layer 41 could be bump plated prior to assembling the acoustic stack 18. For certain processes, the bump plating may be performed before dicing the acoustic stack 18. However, the bump plating could also be performed after the dicing is completed. For example the UBM could be applied prior to assembling the acoustic stack 18, and the electrically conductive bumps 35 could be formed after the acoustic stack 18 has been diced. Alternatively, and as discussed above, an anisotropic electrically conductive adhesive may take the place of the bump/solder. For other low cost configurations (also not shown), electrically conductive bumps 35 may be deposited directly on the acoustic elements 4 (that is, there is no UBM between the acoustic elements and the solder bumps 35).

For the processes illustrated in FIGS. 3, 5 and 6, the manufacturing method further optionally includes assembling a common ground electrode 6 to each of the respective diced, acoustic stacks 18. Additional optional processing steps may be performed. For example, and as discussed above, prior to lamination to the piezoelectric layer 42, a tungsten carbide acoustic impedance dematching layer 41 may undergo sputtering of a layer of titanium (not shown) in order to provide a seed layer (not shown) for the UBM 33. Next, a layer of nickel may be evaporated on the tungsten carbide acoustic impedance dematching layer 41 in order to provide the proper pad for attaching the solder balls 35. This is followed by a very thin flash layer of gold (not shown) to prevent oxidation of the nickel. The tungsten carbide acoustic impedance dematching layer 41 containing the UBM 33 may then be bonded to the piezoelectric layer 42 and a graphite support layer 2 as thin, solid slabs of material bonded with an adhesive. Suitable nonconductive adhesives include, without limitation epoxy, polyurethane, and acrylate adhesives and may be bonded using high pressure. Alternately conductive and anisotropically conducting adhesives may be used to bond the dematching layer to the piezoelectric layer.

Beneficially, the above-described manufacturing method can be used to manufacture larger area acoustic assemblies at relatively low cost and with relatively high yield. The manufacturing method facilitates the use of numerically controlled pick-and-place machines to surface mount the acoustic arrays 40 with the graphite support layer 2 (or remaining portion thereof) providing mechanical support for the acoustic pillars during the pick-and-place operation.

Another method of manufacturing an ultrasound acoustic assembly (100 is described with reference to FIGS. 8-13. As indicated, for example in FIG. 8, the manufacturing method includes depositing an under-bump metallization (UBM) 33 on a number of acoustic impedance dematching regions (tiles) 41. As indicated in FIG. 9, the manufacturing method further includes disposing a number of electrically conductive bumps 38 on a substrate 50. Alternatively and as indicated in FIG. 12, the manufacturing method may include disposing a number of electrically conductive bumps 38 on application specific integrated circuit (ASIC) die 32. Non-limiting examples of electrically conductive bumps 38 include solder bumps, for example, eutectic (lead tin) solder or lead free solder, as well as gold-stud bumps or Seki-Sui balls. Substrate 50 may comprise an interposer 50 or flexible substrate 50. As noted above, reference numeral 50 is used to denote both the interposer and the flexible substrate, for ease of illustration.

Non-limiting examples of interposers and flexible substrates include high density interconnects.

For the arrangement shown in FIG. 9, the manufacturing method further includes disposing the acoustic impedance dematching regions 41 on the substrate 50. For this arrangement, the electrically conductive bumps 35 are disposed between the acoustic impedance dematching regions 41 and substrate 50. More particularly, for the specific arrangement shown in FIG. 9, partially diced, tungsten carbide tiles 41 are disposed on a substrate 50. Alternatively and as indicated in FIG. 12, the manufacturing method may further include disposing the acoustic impedance dematching regions 41 on the ASIC die 32, where the electrically conductive bumps 35 are disposed between the acoustic impedance dematching regions 41 and ASIC die 32. For example, partially diced, tungsten carbide tiles 41 may be disposed on a substrate 50. As used here, the term "disposed" should be understood to encompass arrangements in which a layer is in direct contact with another layer, as well as layers in indirect contact (for example separated by bumps 35, 37 or other electrical connection means and/or separated by fillers.)

Figure 8:
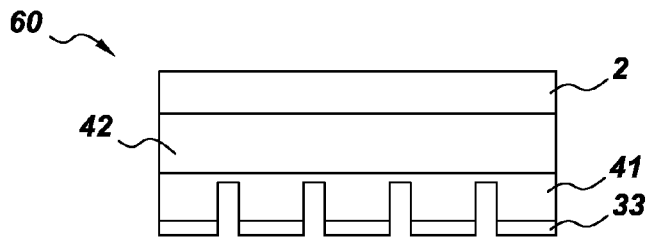
FIG. 8 is a schematic cross-sectional view of an example laminated acoustic assembly.
Figure 9:
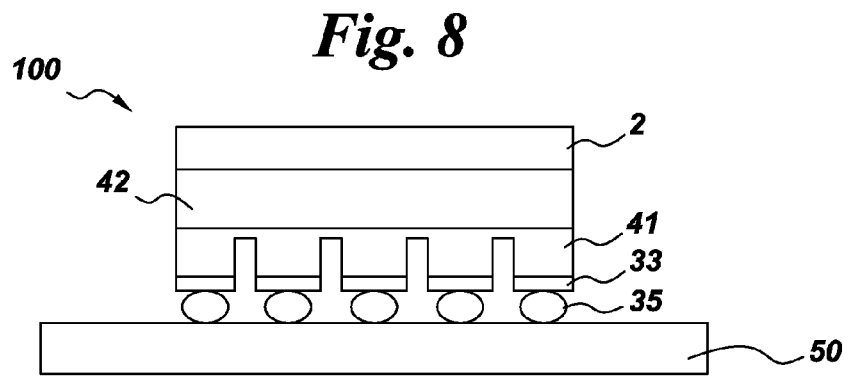
FIG. 9 is a schematic cross-sectional view of the example laminated acoustic assembly of FIG. 8 disposed on a substrate.
Figure 10:
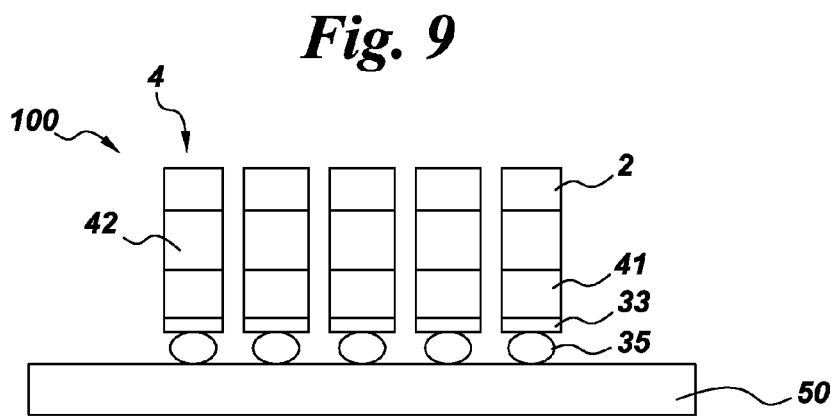
FIG. 10 is a schematic cross-sectional view of the assembly of FIG. 9 after singulation.

Although not expressly shown, the manufacturing method illustrated by FIGS. 8-10 further includes performing a reflow operation, such that a number of uniform electrical connections are formed between the acoustic impedance dematching regions 41 and the respective ASIC die 32 or (intervening) substrate 50. For example, the reflow process reforms conductive bumps 35, such that they provide uniform connections between the acoustic impedance dematching regions 41 and the ASIC die 32/substrate 50.

As indicated in FIGS. 8-12, the manufacturing method further includes disposing at least one piezoelectric region 42 on the acoustic impedance dematching regions 41 to form respective acoustic stacks 18. In addition, for the specific arrangements shown in FIGS. 8-10, an optional acoustic matching layer 2 may be disposed on the piezoelectric region 42. As discussed below, the order in which the acoustic layers 41, 42 and 2 are assembled and singulated to form acoustic elements 4 varies, depending on the particular process.

For the process illustrated by FIG. 10, the manufacturing method further includes singulating the acoustic stacks 18 to form a number of acoustic elements 4. As discussed below, singulation may be performed using a number of techniques. For the particular process illustrated by FIGS. 8-10, the singulation is performed after the acoustic impedance dematching regions 41 and the piezoelectric region(s) 42 have been disposed within the ultrasound acoustic assembly 100.

For the particular process shown in FIGS. 8 and 9, the manufacturing method further includes partially dicing the acoustic impedance dematching regions 41 prior to disposing the acoustic impedance dematching regions 41 on the substrate 50, such that a portion of each of the respective acoustic impedance dematching regions 41 remains after the partial dicing, and where the singulation comprises dicing both the piezoelectric region(s) 42 and the remaining portion of the acoustic impedance dematching regions 41. For example, the acoustic impedance dematching regions 41 may be partially diced by laser dicing or by etching, for example by performing a dry reactive ion etch (DRIE). Further, the dice may extend about ninety percent, for example, into the acoustic impedance dematching regions 41.

For the process illustrated by FIG. 12, the manufacturing method further includes partially dicing the acoustic impedance dematching regions 41 prior to disposing the acoustic impedance dematching regions 41 on the ASIC die 32, such that a portion of each of the respective acoustic impedance dematching regions 41 remains after the partial dicing, and where the singulation comprises dicing both the piezoelectric region(s) 42 and the remaining portion of the acoustic impedance dematching regions 41. Although the configurations shown in FIGS. 8-12 use partially diced tungsten carbide tiles 41, for other arrangements, the tungsten carbide tiles 41 are not diced prior to assembly to the substrate 50 or to the ASIC die 32.

Figure 11:
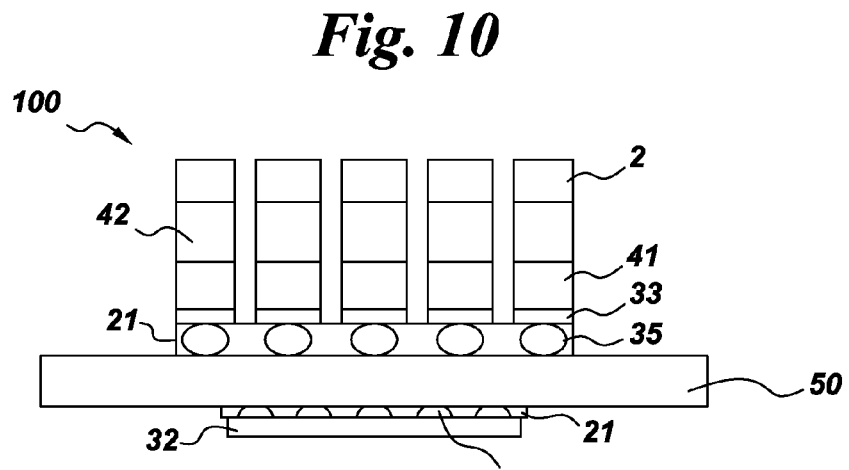
FIG. 11 is a schematic cross-sectional view of the assembly of FIG. 9 coupled to an ASIC die.
Figure 12:
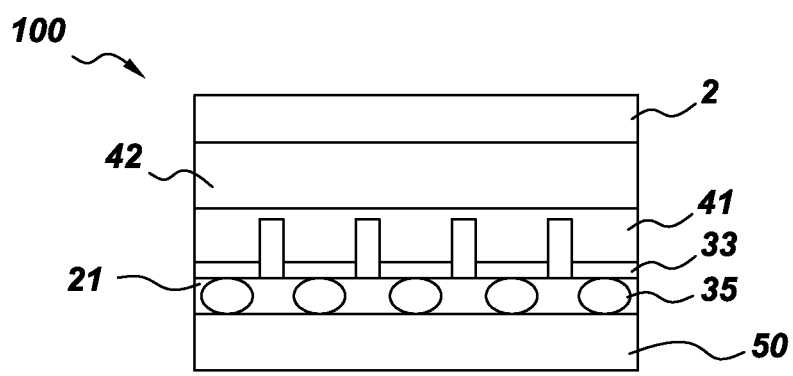
FIG. 12 is a schematic cross-sectional view of the example laminated acoustic assembly of FIG. 8 disposed directly on an ASIC die.

As indicated in FIG. 11, for example, the manufacturing method may further optionally include disposing epoxy 21 between the acoustic impedance dematching regions 41 and the substrate 50, where the epoxy is disposed after disposing the partially diced, acoustic impedance dematching regions 41 on the substrate 50. For the arrangement shown in FIG. 12, the manufacturing method would further optionally include disposing epoxy 21 between the acoustic impedance dematching regions 41 and the ASIC die 32, where the epoxy is disposed after disposing the partially diced, acoustic impedance dematching regions 41 on the ASIC die 32. The epoxy adhesive 21 would be wicked in, thereby helping to secure the partially diced tungsten carbide tiles 41 to the substrate 50 (FIG. 11) or to the ASIC die 32 (FIG. 12), even if the solder bumps 35 cannot support the remaining pillars of the partially diced, tungsten carbide tiles 41.

Figure 13:
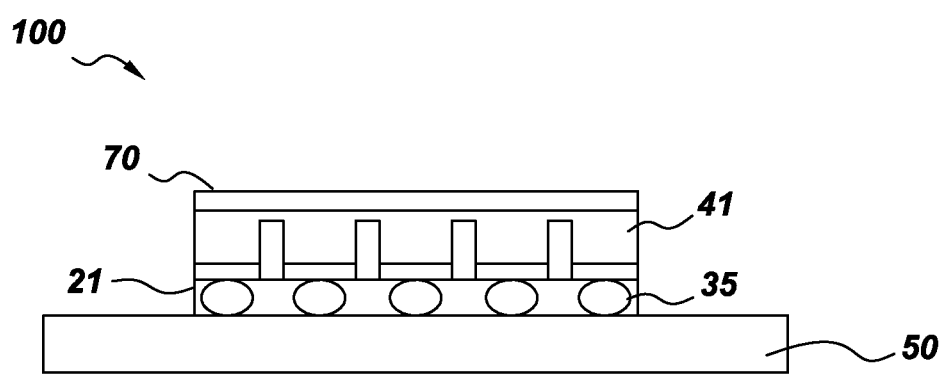
FIG. 13 is a schematic cross-sectional view showing a gold layer disposed on a polished upper surface of an acoustic impedance dematching layer to facilitate the subsequent laminations shown in FIGS. 8-12.

The manufacturing method may further optionally include performing a surface treatment on an upper surface of the acoustic impedance dematching regions 41 after disposing the epoxy. For example, the upper surface of the entire array of acoustic impedance dematching regions 41 may be ground, in order to form a flat surface to facilitate further lamination. As indicated in FIG. 13 for example, the manufacturing method may further optionally include disposing a gold layer 70 on the upper surface of the acoustic impedance dematching regions 41 after performing the surface treatment. For example, a gold layer 70 (for example, about 1000 Angstroms thick) may be sputtered onto the polished upper surface of the array of acoustic impedance dematching regions 41 to prepare for subsequent lamination.

For particular processes and as shown in FIG. 8, for example, the piezoelectric region(s) 42 is (are) disposed on the partially diced, acoustic impedance dematching regions 41 and optionally an accoustic matching layer 2, for example graphite, is disposed on the piezoelectric region(s) 42 prior to disposing the acoustic impedance dematching regions 41 on the substrate 50 (FIG. 8) or on the ASIC die 32 (FIG. 12). However, as noted above, the order in which the acoustic layers 41, 42 and 2 are assembled and singulated to form acoustic elements 4 varies, depending on the particular process. Further, although not expressly shown, the manufacturing method may further include disposing a number of optical alignment structures (not shown) on the substrate 50 prior to disposing the acoustic impedance dematching regions 41 on the substrate 50. Beneficially, the optical alignment structures may be used to align a dicing saw or other singulation means to the underlying tungsten carbide grid 41 when dicing the piezoelectric 42 and graphite 2 layers.

Beneficially, the above-described manufacturing methods, acoustic arrays, and acoustic assemblies provide relatively low-cost, high yield means for forming larger area acoustic assemblies with integrated front-end electronics. The resulting integrated acoustic assemblies can beneficially be used in a variety of applications, such as computed tomography, ultrasound, and digital x-ray, among others.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An ultrasound acoustic assembly comprising:
a plurality of ultrasound acoustic arrays, each array comprising an acoustic stack comprising a piezoelectric layer assembled with at least one acoustic impedance dematching layer and with a support layer, wherein the acoustic stack defines a plurality of dicing kerfs and a plurality of acoustic elements, such that the dicing kerfs are formed between neighboring ones of the acoustic elements, and wherein the dicing kerfs extend through the piezoelectric layer and through the acoustic impedance dematching layer(s) but extend only partially through the support layer;
a plurality of application specific integrated circuit (ASIC) die, wherein each ultrasound acoustic array is coupled to a respective one of the ASIC die to form a respective acoustic-electric transducer module wherein each of the acoustic arrays comprises an anisotropic electrically conductive adhesive connected to the acoustic elements; and
one or more substrates disposed between the ultrasound acoustic arrays and the ASIC die.

2. The ultrasound acoustic assembly of claim 1, wherein the support layer comprises a material selected from the group consisting of graphite, ceramic, silicon, flexible organic polymer, and combinations thereof.

3. The ultrasound acoustic assembly of claim 1, wherein each of the acoustic arrays further comprises:
an under-bump metallization (UBM) connected to the acoustic elements;
a plurality of conductive bumps connected to the UBM to form a plurality of raised electrical contacts for the acoustic array; and
a common ground electrode connected to the diced, acoustic stack.

4. The acoustic assembly of claim 1, wherein the acoustic impedance dematching layer comprises a tungsten carbide high impedance dematching layer.

5. The acoustic assembly of claim 1, further comprising a base substrate connected to the ASIC die.

6. The acoustic assembly of claim 5, wherein the base substrate comprises a curved, flexible substrate, such that the acoustic assembly comprises a curved acoustic assembly.

* * * * *